US012772544B2

(12) United States Patent
Wu et al.

(10) Patent No.: US 12,772,544 B2
(45) Date of Patent: Oct. 20, 2026

(54) SEMICONDUCTOR STRUCTURE INCLUDING VERTICAL DIODE DEVICE AND METHOD OF MANUFACTURING THE SAME

(71) Applicant: TAIWAN SEMICONDUCTOR MANUFACTURING COMPANY, LTD., Hsinchu (TW)

(72) Inventors: Dai-Yan Wu, Hsinchu (TW); Yu-Chiun Lin, Hsinchu (TW); Po-Nien Chen, Hsinchu (TW); Hsiao-Han Liu, Hsinchu (TW); Chih-Yung Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 539 days.

(21) Appl. No.: 18/321,343

(22) Filed: May 22, 2023

(65) Prior Publication Data

US 2024/0395803 A1 Nov. 28, 2024

(51) Int. Cl.

| | |
|---|---|
| ***H10D 84/80*** | (2025.01) |
| ***H10D 8/01*** | (2025.01) |
| ***H10D 8/50*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.

CPC ............. *H10D 84/811* (2025.01); *H10D 8/01* (2025.01); *H10D 8/50* (2025.01); *H10D 30/014* (2025.01); *H10D 30/43* (2025.01); *H10D 30/6735* (2025.01); *H10D 62/121* (2025.01); *H10D 64/017* (2025.01); *H10D 64/018* (2025.01)

(58) Field of Classification Search

None

See application file for complete search history.

(56) References Cited

U.S. PATENT DOCUMENTS

| | | | | |
|---|---|---|---|---|
| 11,145,678 B2 * | 10/2021 | Liu | ...................... | H10D 84/038 |
| 2015/0123236 A1 * | 5/2015 | Lin | ...................... | H10D 8/043 438/527 |
| 2022/0059524 A1 * | 2/2022 | Hsu | .................... | H10D 30/6735 |
| 2023/0089395 A1 * | 3/2023 | Orr | ...................... | H10D 88/00 257/369 |
| 2024/0379657 A1 * | 11/2024 | Hook | .................. | H10D 62/121 |

* cited by examiner

*Primary Examiner* — Alexander G Ghyka

(74) *Attorney, Agent, or Firm* — Birch, Stewart, Kolasch & Birch, LLP

(57) ABSTRACT

A semiconductor structure includes a base structure, at least one diode device and a semiconductor device. The base structure has a first base region and a second base region. The at least one diode device includes a first feature formed in the first base region, and a second feature formed over the first feature and having a conductivity type opposite to that of the first feature. The semiconductor device is formed on the second base region.

20 Claims, 12 Drawing Sheets

SEMICONDUCTOR STRUCTURE INCLUDING VERTICAL DIODE DEVICE AND METHOD OF MANUFACTURING THE SAME

BACKGROUND

To meet the demand of semiconductor devices with reduced size and improved working performance, new semiconductor structures are developed using new technologies including more advanced fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
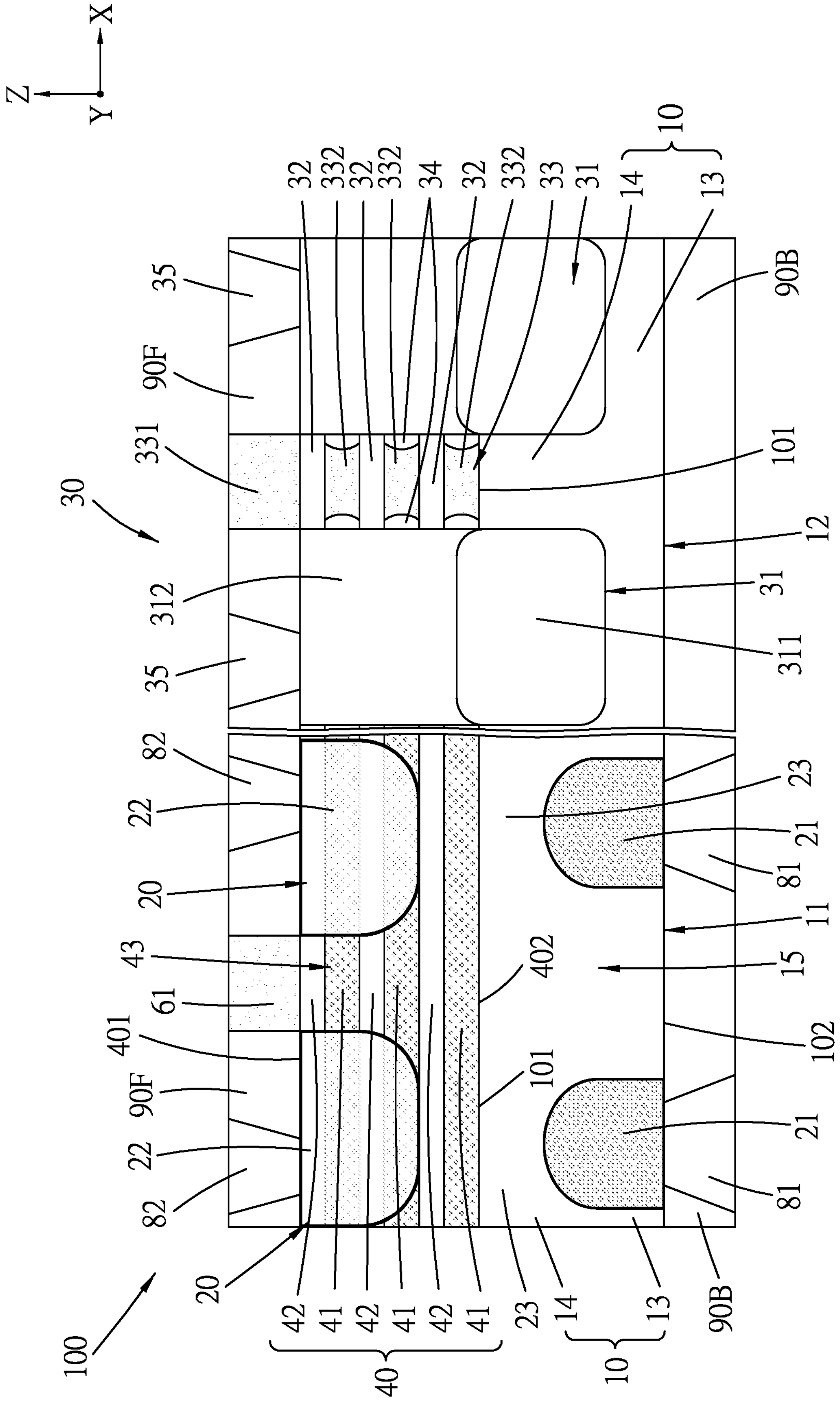
FIG. 1 is schematic view illustrating a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "bottommost," "upper," "uppermost." "lower," "lowermost," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

A diode may be included in a semiconductor structure to allow a current passing therethrough in a predetermined direction. In advanced node technology, in which super power rail scheme is adopted, dopant wells may be absent from the semiconductor structure, and p-n junction is formed by directly implanting n-type dopants and p-type dopants at an upper surface of a semiconductor stack of the semiconductor structure (in which the semiconductor stack may include a plurality of semiconductor layers), thereby forming a diode. Lateral diodes may be formed in the semiconductor stack, and current flows laterally (in a direction perpendicular to stacking direction of the semiconductor layers). The industry strives to improve working performance of the diode, and to integrate manufacturing of the diode into manufacturing of other complementary metal oxide semiconductor (CMOS) elements.

The present disclosure is directed to a semiconductor structure, and a method for manufacturing the same. The semiconductor structure includes a vertical diode and a semiconductor device formed on a base structure. Elements of the vertical diode are arranged in a direction normal to a back surface of the base structure (such direction is also referred to as a normal direction). That is, in the vertical diode, a p-type region and an n-type region are faced to each other in the normal direction, such that an electric current is permitted to pass through the vertical diode in the normal direction. The semiconductor device may be a fin-type transistor (FinFET), a nanosheet semiconductor device, such as a gate-all-around-field-effect transistor (GAA FET), a forksheet-based device, a complementary transistors (CFET), but is not limited thereto.

Figure 3:
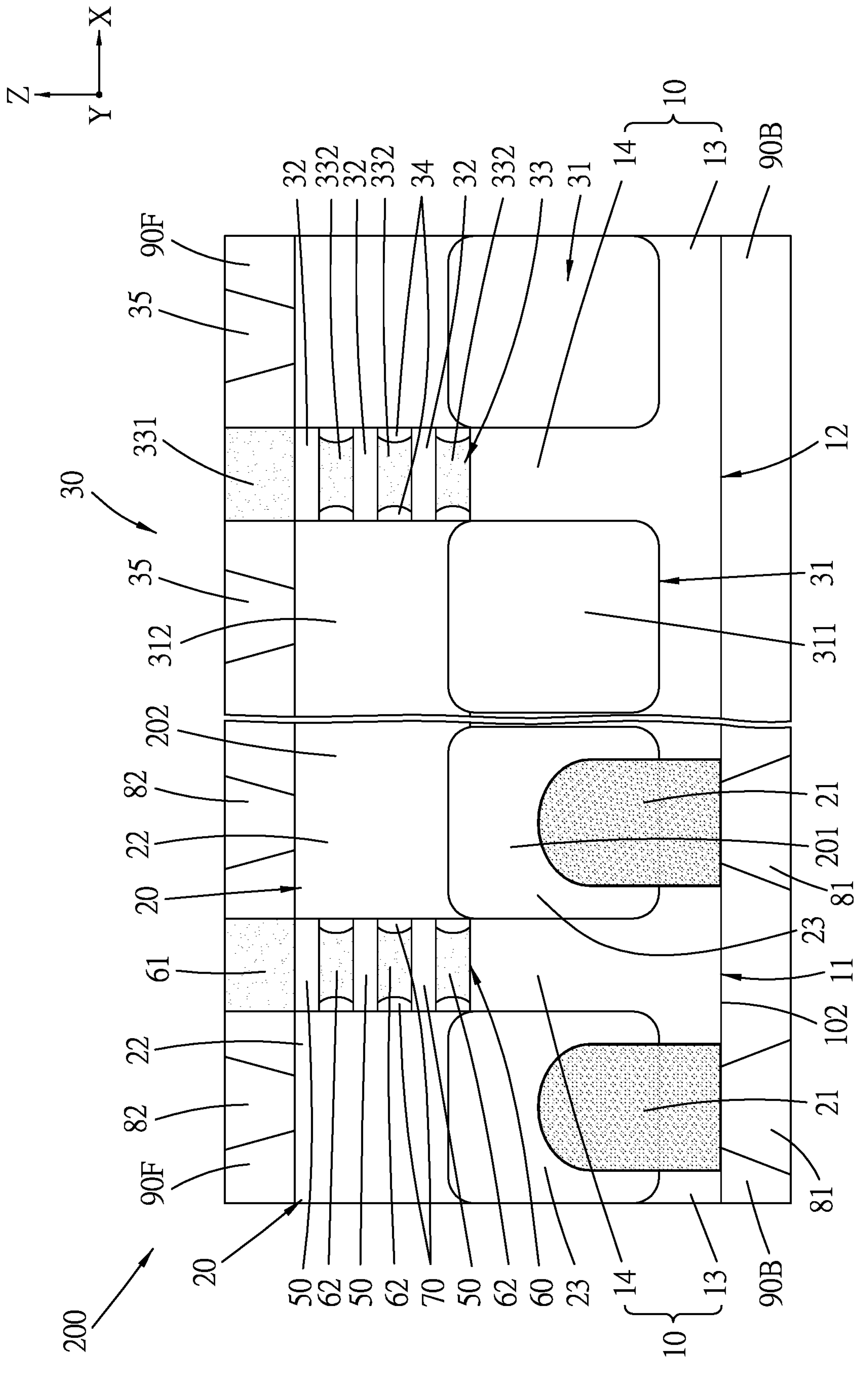
FIG. 3 is schematic view illustrating another semiconductor structure in accordance with some embodiments.

FIGS. 1 and 3 show different semiconductor structures in accordance with some embodiments of the present disclosure. Referring to FIG. 1, a semiconductor structure 100 includes a base structure 10, a diode device 20, and a semiconductor device 30.

The base structure 10 has a first base region 11 formed with the diode device 20, and a second base region 12 formed with the semiconductor device 30. The base structure 10 has a front surface 101, and a back surface 102 opposite to the front surface 101.

The base structure 10 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the base structure 10 may be doped with p-type impurities or n-type impurities, or undoped. In addition, base structure 10 may be a bulk silicon substrate, a silicon-on-insulator (SOI) substrate, or a germanium-on-insulator (GOI) substrate. Other suitable materials for the base structure 10 are within the contemplated scope of disclosure. In some embodiments, the base structure 10 is made of silicon (Si) and has an intrinsic conductivity type.

The diode device 20 includes a first feature 21 formed in the first base region 11, and a second feature 22 formed over the first feature 21. In some embodiments, the second feature 22 is disposed on the first feature 21 over the front surface 101, such that the first and second features 21, 22 face to each other along a Z direction normal to the back surface 102 of the base structure 10.

In some embodiments, the second feature 22 is formed on the first base region 11 in a semiconductor stack 40. The semiconductor stack 40 has an upper surface 401, and a lower surface 402 opposite to the upper surface 401 and connected to the front surface 101 of the base structure 10 at the first base region 11. The first feature 21 extends from the back surface 102 at the first base region 11 toward the second feature 22, and the second feature 22 extends from the upper surface 401 toward the first feature 21.

The first and second features 21, 22 have opposite conductivity type. As such, the first and second features 21, 22 having different polarities face to each other along the Z direction, and an electric current is permitted to pass through the diode device 20 in the Z direction. The diode device 20 may be regarded as a vertical diode. In some embodiments, the first feature 21 has a p-type conductivity, and the second feature 22 has an n-type conductivity, or vice versa in other embodiments. In such case, the first feature 21 having the p-type conductivity serves as a p-type region or an anode of the diode device 20, and the second feature 22 having the n-type conductivity serves as an n-type region or a cathode of the diode device 20. An electrical current is permitted to flow form the anode (e.g., the p-type first feature 21) to the cathode (e.g., the n-type second feature 22) of the diode device 20.

In some embodiments, the first feature 21 may have a p-type conductivity and may include a p-type dopant such as boron, or other suitable materials, or combinations thereof, with a dopant concentration ranging from about 1E19 atoms/$cm^3$ to about 1E21 atoms/$cm^3$. The first feature 21 may have a thickness (measured along the Z direction) ranging from about 30 nm to about 50 nm. The second feature 22 may have an n-type conductivity and may include an n-type dopant such as phosphorous, nitrogen, arsenic, antimony, other suitable materials, or combinations thereof, with a dopant concentration ranging from about 1E19 atoms/$cm^3$ to about 1E21 atoms/$cm^3$. The second feature 22 may have a thickness (measured along the Z direction) ranging from about 40 nm to about 70 nm. Other suitable dopants, dopant concentration, or thickness for each of the first and second features 21, 22 are within the contemplated scope of disclosure.

The semiconductor stack 40 includes a plurality of first semiconductor layers 41, and a plurality of second semiconductor layers 42 disposed to alternate with the first semiconductor layers 41 along the Z direction. A number of the first semiconductor layers 41 and a number of the second semiconductor layers 42 are determined according to practical requirements. In the exemplary example shown in FIG. 1, the number of the first semiconductor layers 41 and the number of the second semiconductor layers 42 are both three. Materials suitable for making the first and second semiconductor layers 41, 42 are similar to those for making the base structure 10, and the first semiconductor layers 41 are made of a material different from that of the second semiconductor layers 42. In some embodiments, the first semiconductor layers 41 are made of silicon germanium (SiGe), and the second semiconductor layers 42 are made of silicon (Si), but are not limited thereto. Other suitable materials for the first and second semiconductor layers 41, 42 are within the contemplated scope of disclosure.

In the case that the first semiconductor layers 41 are made of SiGe and the second semiconductor layers 42 are made of Si, and that the p-type region and the n-type region (not shown) are both formed in the semiconductor stack 40 and are spaced apart from each other by a portion of the semiconductor stack 40 in an X direction transverse (e.g., perpendicular) to the Z direction, the lattice mismatch defects between SiGe and Si may cause an electric current flowing through the portion of the semiconductor stack 40 along interfaces between SiGe and Si undesirably deviates from an ideal value. In the present disclosure, as aforementioned, the first and second features 21, 22 having different polarities face to each other along the Z direction, which is along a disposal direction of the first and second semiconductor layers 41, 42, and which is, perpendicular to interfaces between the first and second semiconductor layers 41, 42. An electric current passing through the diode device 20 flows in a manner perpendicular to the interfaces between the first and second semiconductor layers 41, 42. Such electric current is found to be less impacted by the lattice mismatch defects between Si and SiGe, and results in an improved ideal factor. That is, charge carriers in the electric current travelling in the semiconductor stack 40 may be less likely to be trapped by the defects, thereby prolonging lifetime of the charge carriers and obtaining a higher forward current output, and the diode device 20 may behave in a manner rather similarly to an ideal diode. In some embodiments, the second feature 22 is formed covering as much interfaces between the first and second semiconductor layer 41, 42 (e.g., along the Z direction) as possible, so as to case impacts due to the lattice mismatch defects.

In addition, in the case that the p-type region and the n-type region formed in the semiconductor stack 40 are spaced apart from each other, the p-type and n-type regions are usually spaced apart by a relatively large distance (e.g. about or greater than 100 nm) in the X direction due to constrains of process flow and/or apparatus used in manufacturing of the semiconductor structure. In the present disclosure, by arranging the first and second features 21, 22 of the diode device 20 vertically, the aforementioned constrains are resolved, which is beneficial to reduce size of the semiconductor structure 100 (e.g., reducing area of the diode device 20 on the base structure 10). Besides, in the present disclosure, it is not necessary for the first and second features 21, 22 to be spaced apart from each other by a certain distance. In some embodiments, the first and second features 21, 22 are in contact with each other, and the diode device 20 is a PN diode.

In some embodiments, the diode device 20 further includes a third feature 23 disposed between the first and second features 21, 22, such that the first and second features 21, 22 are spaced apart from each other by the third feature 23. A portion of the third feature 23 is formed in the first base region 11, and a portion of the third feature 23 is formed in the semiconductor stack 40. The third feature 23 may have a dopant concentration lower than that of each of the first and second features 21, 22. In some embodiments, the third feature 23 has an intrinsic conductivity type, and the diode device 20 is a PIN diode. The third feature 23 may have a thickness (measured along the Z direction) approximately greater than 0 and not greater than about 100 nm.

As shown in FIG. 1, in some embodiments, the semiconductor structure 100 may have two the aforementioned diode devices 20, or more in some other embodiments, but are not limited thereto.

The first features 21 of the two diode devices 20 are formed in the first base region 11, and are spaced apart from each other in the X direction by a first in-between region 15. The second features 22 of the two diode devices 20 are formed in the semiconductor stack 40, and are spaced apart from each other in the X direction by a second in-between region 43 which is located above the first in-between region. The X direction is transverse (e.g., perpendicular) to the Z direction.

The semiconductor structure 100 may further include a back dielectric layer 90B formed on the back surface 102 of the base structure 10, and a front dielectric layer 90F formed on the upper surface 401 of the semiconductor stack 40. The back and front dielectric layers 90B, 90F may include a dielectric material such as silicon oxide, silicon nitride, or the like, or combinations thereof, but are not limited thereto. Other materials suitable for forming the dielectric layers 90B, 90F are within the contemplated scope of the present disclosure.

The semiconductor structure 100 may further include two back side contacts 81 and two front side contacts 82. The back side contacts 81 are formed in the back dielectric layer 90B on the first base region 11, and are respectively connected to the first features 21 of the two diode devices 20. The front side contacts 82 are formed in the front dielectric layer 90F and are respectively connected to the second features 22 of the two diode devices 20. The back side contacts 81 and the front side contacts 82 cooperatively permit the diode devices 20 to be connected to an external power source from back side, and front side of the semiconductor structure 100, respectively. In some embodiments, the back side contacts 81 and the front side contacts 82 may each include for example, but not limited to, tungsten (W), aluminum (Al), ruthenium (Ru), cobalt (Co), copper (Cu), palladium (Pd), nickel (Ni), platinum (Pt), a low resistivity metal, or the like, or combinations thereof.

In some embodiments, the semiconductor structure 100 further includes a dummy gate 61 in the front dielectric layer 90F on the upper surface 401 over the first in-between region 15 and the second in-between region 43. The dummy gate 61 elongates along a Y direction transverse (e.g., perpendicular) to both the X direction and the Z direction. In some embodiments, the dummy gate 61 does not necessarily serve any functional purpose in the diode devices 20 and is not connected to an external power source.

Figure 2:
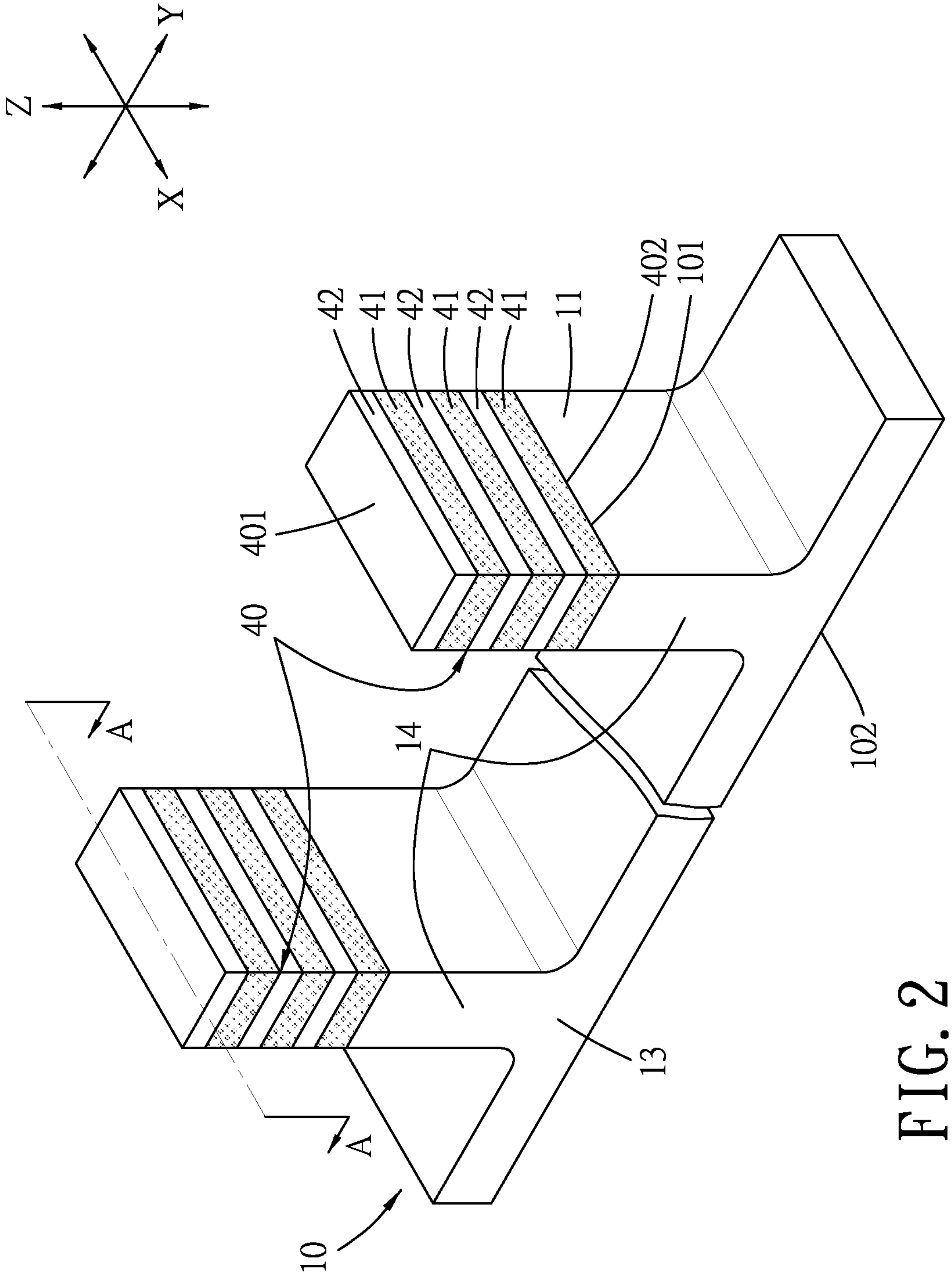
FIG. 2 is a schematic view illustrating a base structure and semiconductor stacks of the semiconductor structure shown in FIG. 1.

In some embodiments, the semiconductor stack 40 is elongated in the X direction. Referring to FIG. 2, in some embodiments, the base structure 10 has a substrate 13, and a plurality of fins 14 that are formed on the substrate 13. In some embodiments, a plurality of isolation sections (not shown, which may include silicon-based dielectric material(s) such as silicon oxide, silicon nitride, or other suitable materials) may be formed on the base structure 100 to isolate the fins 14 from each other. The fins 14 are each elongated in the X direction and are spaced apart from each other in the Y direction. In some embodiments, the semiconductor device 30 and the diode devices 20 may be located on the same fin 14 (i.e., the semiconductor device 30 and the diode devices 20 are displaced from each other in the X direction); while in other embodiments, the semiconductor device 30 and the diode devices 20 may be located on different fins 14 (i.e., the semiconductor device 30 and the diode devices 20 are displaced from each other in the Y direction).

The semiconductor device 30 is formed on the second base region 12 of the base structure 10. Exemplarily, the semiconductor device 30 shown in FIG. 1 is a GAA device, but is not limited thereto. Other suitable devices serving as the semiconductor device 30 are within the contemplated scope of the present disclosure.

The semiconductor device 30 includes two source/drain features 31 spaced apart from each other in the X direction and respectively disposed in recesses (not shown) formed in the fin 14 at the second base region 12. Please note that the source/drain features 31 may refer to a source or a drain, individually or collectively dependent upon the context. The source/drain features 31 may be made of a single crystalline silicon, a polycrystalline silicon, a single crystalline silicon germanium, a polycrystalline silicon germanium, or other suitable materials, and may be doped with n-type dopant(s) or p-type dopants. Other suitable materials for the source/drain features 31 are within the contemplated scope of the present disclosure.

In some embodiments, each of the source/drain features 31 may include multiple epitaxy layers (e.g., epitaxy layers 311, 312) that are formed by an epitaxy growth process, and that are in situ doped with different dopant concentrations. The epitaxy layer(s) located closer to the base structure 10 may have a relatively lower dopant concentration, while the epitaxy layer(s) located away from the base structure 10 may have a relatively higher dopant concentration. In some embodiments, as shown in FIG. 1, each of the source/drain features 31 has an intrinsic epitaxy layer (L0, e.g., the epitaxy layer 311) disposed on the base structure 10, and an in situ doped epitaxy layer (e.g., the epitaxy layer 312 including L1, L2, L3 . . . ) disposed on the intrinsic epitaxy layer 311 opposite to the base structure 10. In some embodiments, the in situ doped epitaxy layer 312 of each of the source/drain features 31 may have a conductivity type same as or different from that of the second features 22 of the diode devices 20. Suitable dopants for the in situ doped epitaxy layer 312 are similar to those for the first features 21 and the second features 22, and details thereof are omitted for the sake of brevity. In this case, since the second features 22 of the diode devices 20 can be formed on the first base region 11 from the semiconductor stack 40, and since the semiconductor devices 30 can be formed on the second base region 12 from the semiconductor stack 40 (see FIGS. 1 and 10), preparation of the diode devices 20 shown in FIG. 1 may be readily integrated into preparation of the semiconductor devices 30, or any other CMOS devices.

The semiconductor device 30 includes active channel features 32 that are spaced apart from each other in the Z direction and that are made of a material same as that of the second semiconductor layers 42 of the semiconductor stack 40 (i.e., Si), or materials for making the base structure 10. Other suitable materials for the active channel features 32 are within the contemplated scope of disclosure. Each of the active channel features 32 interconnects the two source/drains features 31.

The semiconductor device 30 includes an active gate feature 33 formed around the active channel features 32. In some embodiments, the active gate feature 33 may include an upper gate 331 and a plurality of lower gates 332, each of which includes a gate dielectric and a gate electrode (not shown). The upper gate 331 is formed over the active channel features 32. Each of the lower gates 332 is disposed around a respective one of the active channel features 32. The gate electrode may be configured as a multi-layered structure including (i) at least one work function metal (which is provided for adjusting threshold voltage of an n-FET or a p-FET), and, (ii) an electrically conductive material having a low resistance (which is provided for reducing electrical resistance of the gate electrode), other suitable materials, or combinations thereof. In some embodiments, the work function metal of the gate electrode for forming an n-FET may be different from that for forming a p-FET so as to permit the n-FET and the p-FET to have different threshold voltages. Other methods suitable for adjusting the threshold voltages are within the contemplated scope of the present disclosure. In some embodiments, the gate electrode may include a metal (e.g., tungsten (W), titanium (Ti), tantalum (Ta), aluminum (Al), or ruthenium (Ru)), a metal-containing nitrides (e.g., titanium nitride (TiN), or tantalum nitride (TaN)), a metal-containing silicide (e.g., nickel silicide (NiSi)), a metal-containing carbide (e.g., tantalum carbide (TaC)), or combinations thereof. The gate dielectric is disposed to entirely separate the gate electrode from the active channel features 32, and may include silicon oxide, silicon nitride, silicon oxynitride, high dielectric constant materials, or combinations thereof. Other suitable materials for the gate electrode and the gate dielectric are within the contemplated scope of disclosure. In some embodiments, the dummy gate 61 may be formed together with the upper gate 331 of the active gate feature 33, and thus may be similar to that of the upper gate 331 in terms of configurations and materials. In some other embodiments, two gate spacers (not shown) are formed at two opposite sides of each of the dummy gate 61 and the upper gate 331. Each of the gate spacers may be a single or multiple layers which may include silicon oxide, silicon nitride, silicon oxynitride, or combinations thereof. Other suitable materials for the gate spacers are within the contemplated scope of disclosure.

The semiconductor device 30 further includes a plurality of inner spacers 34 that are disposed to separate the two sources/drain features 31 from the active gate features 33. The inner spacers 34 may be made of silicon oxide, silicon nitride, silicon oxynitride, high dielectric constant materials, other suitable materials, or combinations thereof. Other suitable materials for the inner spacers 34 are within the contemplated scope of disclosure.

The semiconductor device 30 further includes a plurality of source/drain contacts 35 that are respectively connected to the source/drain features 31. Suitable materials for forming the source/drain contacts 35 are similar to those for forming the back side contacts 81 and the front side contacts 82, and thus details thereof are omitted for the sake of brevity.

The front dielectric layer 90F is also configured to surround the upper gate 331 and the source/drain contacts 35 at the second base region 12. The back dielectric layer 90B also covers the back surface 102 at the second base region 12.

In the diode devices 20 of the semiconductor structure 100, the second features 22 are formed in the semiconductor stack 40, through for example, but not limited to, ex-situ doping, such as performing ion implantation to the semiconductor stack 40 over the first base region 11. The method for preparing the diode devices 20 will be described later in FIGS. 4 to 8.

Referring to FIG. 3, in other embodiments, the second features 22 may also be formed in an epitaxy layer through for example, but not limited to, in situ doping, during an epitaxy growth process. The semiconductor structure 200 will be described in the following paragraphs, and the method for preparing the same will be discussed in FIGS. 9 to 14.

In the semiconductor structure 200 shown in FIG. 3, the second base region 12 and the semiconductor device 30 are similar to those described in the semiconductor structure 100 with reference to FIG. 1, and thus details thereof are omitted for the sake of brevity.

The differences between the two semiconductor structures 100, 200 are that, in the semiconductor structure 200, a plurality of epitaxy units (that are formed from the semiconductor stack 40, see FIGS. 9 to 14) are formed on the first base region 11, and the second features 22 are respectively formed in the epitaxy units (see FIG. 3), instead of in the semiconductor stack 40 (see FIG. 1).

The epitaxy units are similar to the source/drain features 31 of the semiconductor devices 30 in terms of materials and configurations, and the details thereof are omitted for the sake of brevity. In some embodiments, each of the epitaxy units includes an intrinsic epitaxy layer (L0, e.g., an epitaxy layer 201, which is similar to the epitaxy layer 311 of each of the source/drain features 31) disposed on the base structure 10, and an in situ doped epitaxy layer (e.g., an epitaxy layer 202 including L1, L2, L3, which is similar to the epitaxy layer 312 of each of the source/drain features 31) disposed on the intrinsic epitaxy layer 201 opposite to the base structure 10.

Each of the epitaxy units, together with a portion of the base structure 10 thereunder, form a respective one of the diode devices 20. To be specific, for each of the epitaxy unit, (i) a portion of the epitaxy layer 201 located proximate to the back surface 102, and the portion of the base structure 10 underneath are subjected to an ion implantation process at the back surface 102, thereby forming the first feature 21 of the respective diode device 20; (ii) a remaining portion of the epitaxy layer 201 that is not subjected to the ion implantation process serves as the third feature 23 of the respective diode device 20; and (iii) the epitaxy layer 202 serves as the second feature 22 of the respective diode device 20. As such, the respective one of the diode devices 20 is formed as a vertical diode, in which an electric current passing therethrough flows in the Z direction. In some embodiments, the epitaxy layers 201, 202 for each of the epitaxy units are respectively formed together with the epitaxy layers 311, 312 for each of the source/drain features 31, and thus, the configuration and the conductivity type of the epitaxy units are similar to or the same as those of the source/drain features 31. Other details of the diode devices 20, such as suitable dopants, dopant concentrations, and thickness of the first, second and third features 21, 22, 23 are similar to those as described with reference to FIG. 1, and thus are omitted for the sake of brevity.

The two diode devices 20 are spaced apart from each other in the X direction. The semiconductor structure 200 further includes a plurality of dummy channel features 50, a dummy gate feature 60 and a plurality of first inner spacers

70. The dummy channel features 50 are spaced apart from each other in the Z direction, each of which interconnects the second features 22 of the two diode devices 20. The dummy gate feature 60 is formed around the dummy channel features 50. In some embodiments, the dummy gate feature 60 includes an upper gate 61 (equivalent to the dummy gate 61 described in FIG. 1) and a plurality of lower gates 62, each of which includes a gate dielectric and a gate electrode (not shown). The upper gate 61 is formed over the dummy channel features 50. Each of the lower gates 62 is disposed around a respective one of the dummy channel features 50. The first inner spacers 70 are disposed to separate the second features 22 of the two diode devices 20 from the dummy gate feature 60. The dummy channel features 50, the dummy gate feature 60, and the first inner spacers 70 are formed respectively together with and thus have configurations respectively similar to the active channel features 32, the active gate feature 33 and second inner spacers 34 of the semiconductor device 30 (equivalent to the inner spacers 34 of the semiconductor device 30 discussed in FIG. 1), and thus details thereof are omitted for the sake of brevity. Since the dummy gate feature 60 does not necessarily serve any functional purpose in the diode devices 20 and is not connected to an external power source, the second features 22 of the diode devices 20 will not be in electrical connection through the dummy channel features 50. Each of the dummy channel features 50, the dummy gate feature 60, and the first inner spacers 70 are made of a material similar to that of the active channel features 32, the active gate feature 33, and the second inner spacers 34, and thus details thereof are omitted for the sake of brevity.

Similar to the semiconductor structure 100, the semiconductor structure 200 also includes the back and front dielectric layers 90B, 90F, the back side contacts 81 and the front side contacts 82, and details thereof are omitted for the sake of brevity. Since the elements 201, 202, 50, 60, 70 at the first base region 11 can be respectively formed together with the elements 311, 312, 32, 33, 34 at the second base region 12, preparation of the diode devices 20 shown in FIG. 3 may be readily integrated into preparation of the semiconductor devices 30, or any other CMOS devices.

Figure 4:
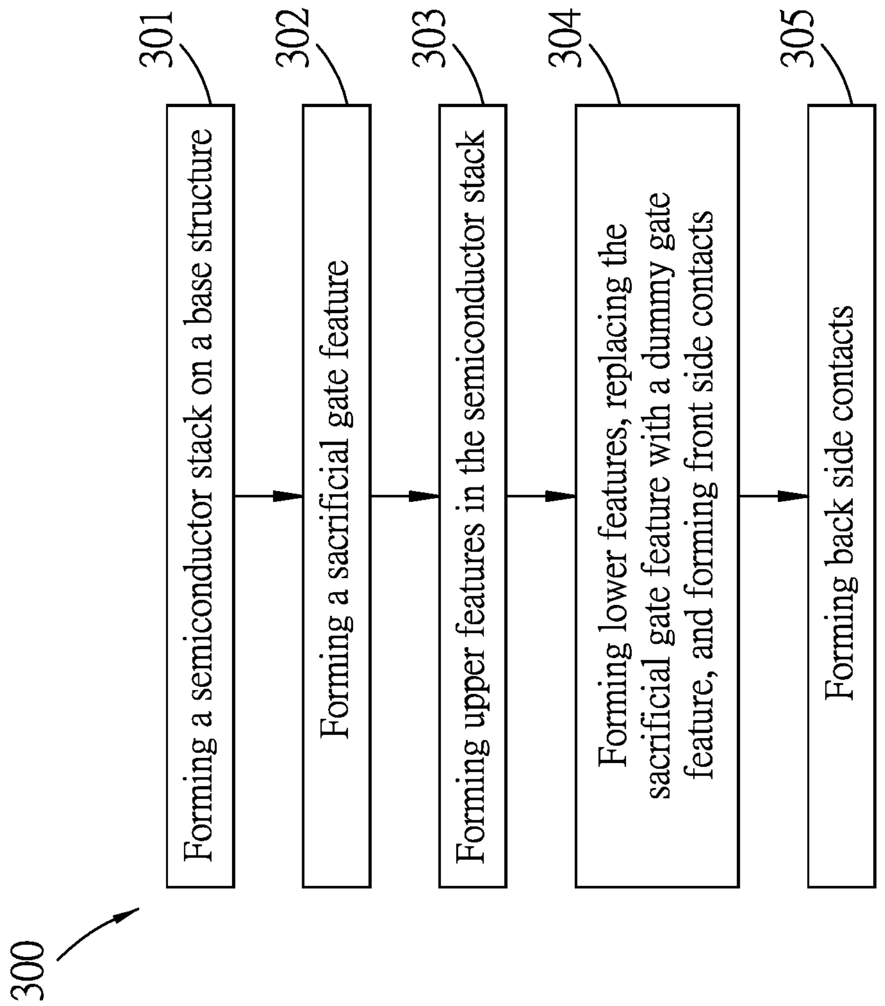
FIG. 4 is a flow diagram illustrating a method for manufacturing diode devices of the semiconductor structure shown in FIG. 1.

FIG. 4 is a flow diagram illustrating a method 300 for manufacturing the diode devices 20 of the semiconductor structure 100 shown in FIG. 1 in accordance with some embodiments of the present disclosure. FIGS. 5 to 8 illustrate schematic views of intermediate stages of the method 300 in accordance with some embodiments. Some repeating structures are omitted in FIGS. 5 to 8 for the sake of brevity. Additional steps can be provided before, after or during the method, and some of the steps described herein may be replaced by other steps or be eliminated.

Figure 5:
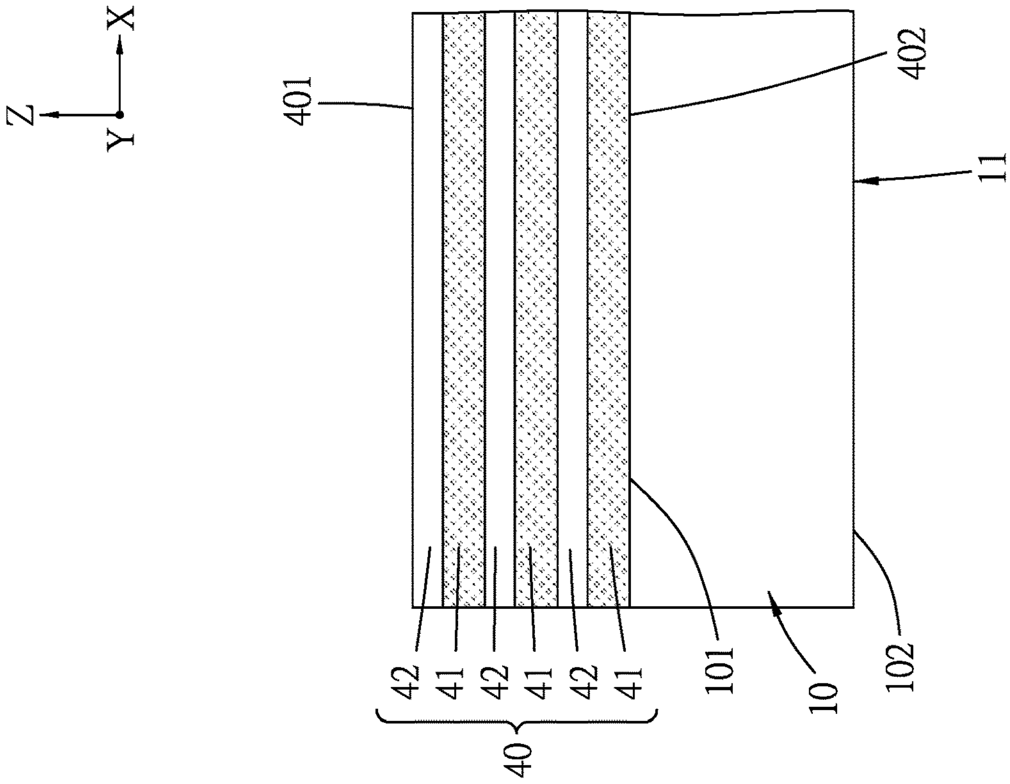

FIG. 5 is a cross-sectional view taken along line A-A of FIG. 2 in accordance with some embodiments. Referring to FIG. 4, and the example illustrated in FIG. 5, the method begins with step 301, where the semiconductor stack 40 is formed on the base structure 10. The lower surface 402 of the semiconductor stack 40 is connected to the front surface 101 of the base structure 10. For the base structure 10, the first base region 11 is configured to be formed with the diode devices 20, and the second base region 12 (not shown in FIGS. 5 to 8) is configured to be formed with the semiconductor device 30 (not shown in FIGS. 5 to 8). In some embodiments, the semiconductor stack 40 and the base structure 10 may have an intrinsic conductivity type to serve as a basis for forming the intrinsic third features 23 in subsequent step. In some embodiments, step 301 is performed by (i) sequentially depositing material layers for forming the first and second first and second semiconductor layers 41, 42 on a starting substrate (not shown) using chemical vapor deposition (CVD), atomic layer deposition (ALD), or other suitable techniques, and (ii) patterning the material layers and the starting substrate using one or more photolithography processes which may include, for example, coating a photoresist, exposing the photoresist through a photomask, developing the photoresist, etching the material layers and/or the starting substrate exposed from the developed photoresist using dry etching, wet etching, other suitable processes, combinations thereof, stripping or ashing the developed photoresist, and/or other suitable processes. Thereafter, the starting substrate is formed into the substrate 13 and the fins 14 shown in FIG. 2, and the material layers are formed into the semiconductor stack 40 on each of the fins 14.

Figure 6:
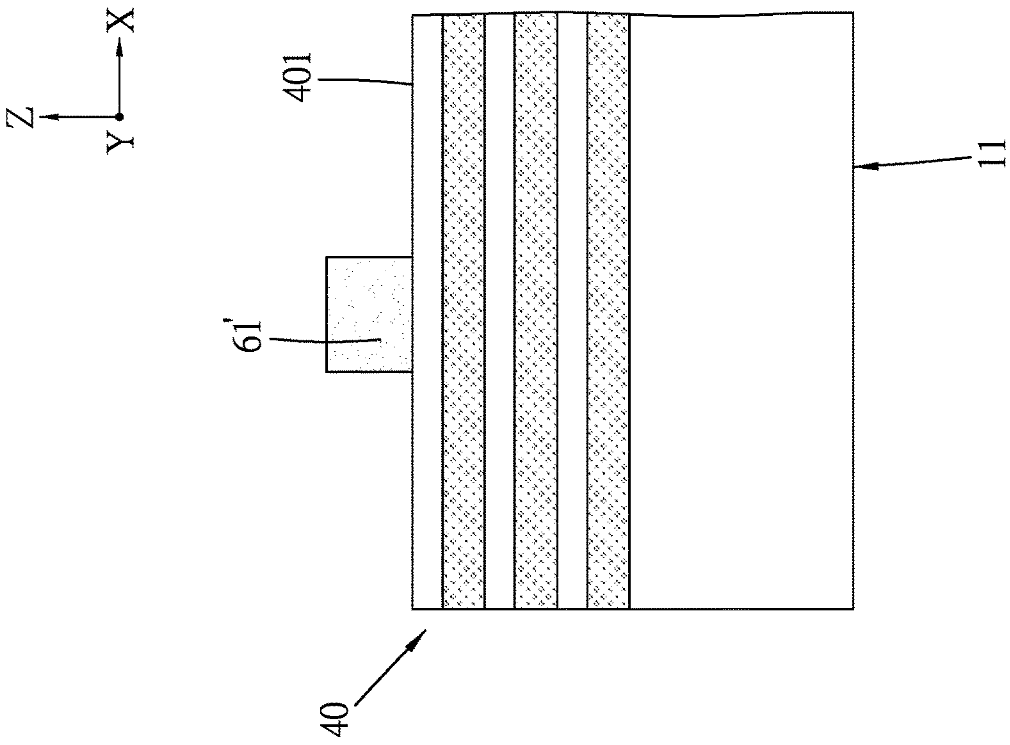
FIGS. 5 to 8 are schematic views illustrating intermediate stages of a method for manufacturing the diode devices shown in FIG. 1 in accordance with some embodiments.

Referring to FIG. 4 and the example illustrated in FIG. 6, the method proceeds to step 302, where a sacrificial gate feature 61' is formed on the upper surface 401 of the semiconductor stack 40. In some embodiments, the sacrificial gate feature 61' may include a sacrificial gate electrode (not shown) which may include polysilicon and a sacrificial gate dielectric which may include a silicon-based dielectric material. Other suitable materials for the sacrificial gate feature 61' are within the contemplated scope of disclosure. The sacrificial gate feature 61' is to be replaced by the dummy gate 61 (see FIG. 1). In some embodiments, in step 302, after forming the sacrificial gate feature 61', the gate spacers (not shown) are formed at two opposite sides of the sacrificial gate feature 61' in the X direction. In some embodiments, step 302 includes (i) depositing material layers for forming the sacrificial gate feature 61' using CVD, ALD or other suitable techniques, (ii) patterning the material layers using one or more photolithography processes (which may include, for example, coating a photoresist, exposing the photoresist through a photomask, developing the photoresist, etching the material layers forming the sacrificial gate feature 61' exposed from the developed photoresist using dry etching, wet etching, other suitable processes, combinations thereof, stripping or ashing the developed photoresist, and/or other suitable processes), and (iii) forming the gate spacers (which may include depositing material layer(s) for forming the gate spacers, followed by anisotropic etching).

Figure 7:
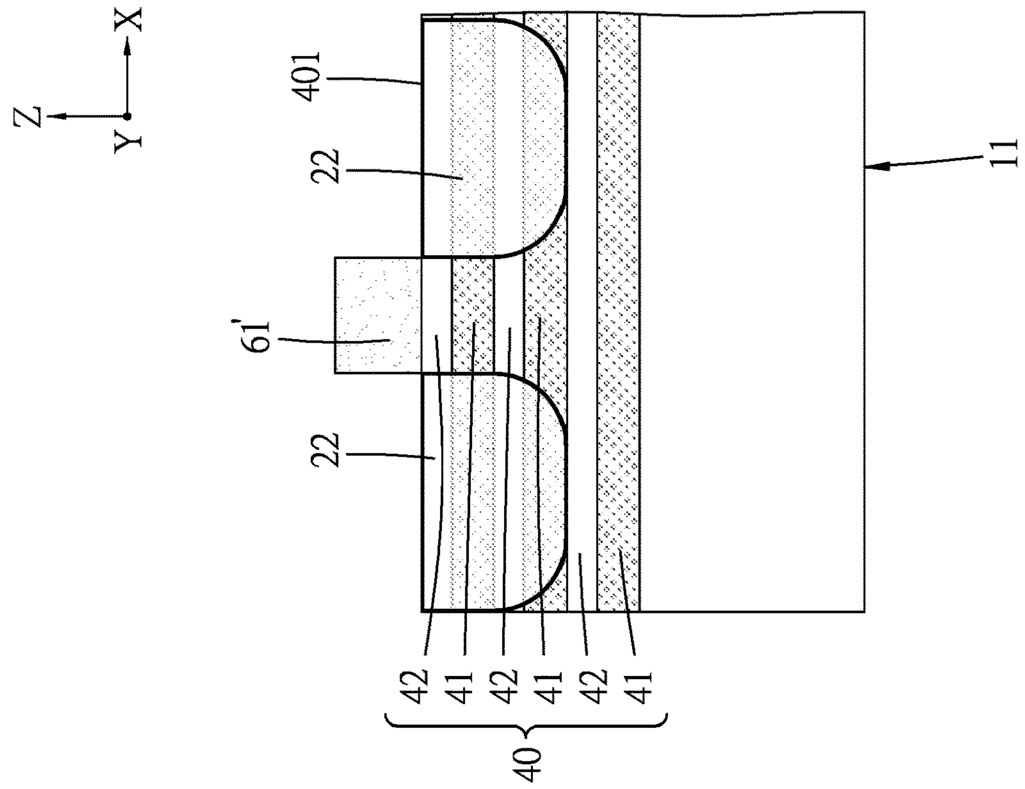

Referring to FIG. 4 and the example illustrated in FIG. 7, the method proceeds to step 303 where upper features 22 (equivalent to the second features 22 described in FIG. 1) are formed by performing a front-side ion implantation process at the upper surface 401 exposed from the sacrificial gate feature 61'. In the front-side ion implantation process, first dopants are implanted into the semiconductor stack 40 through the upper surface 401 to form the two upper features 22, each of which extends from the upper surface 401 toward the base structure 10. The first dopants are responsible for the conductivity type of the upper features 22 (i.e. second features 22).

Parameters for the front-side ion implantation process may be adjusted to obtain the desired upper features 22. For instance, in some embodiments, the upper features 22 are formed as thick as possible (along the Z direction) by allowing the first dopants penetrating into the semiconductor stack 40, such that the electric current passing through the diode devices 20 formed thereby is less affected by the lattice mismatch defects between the first and second semiconductor layers 41, 42.

Figure 8:
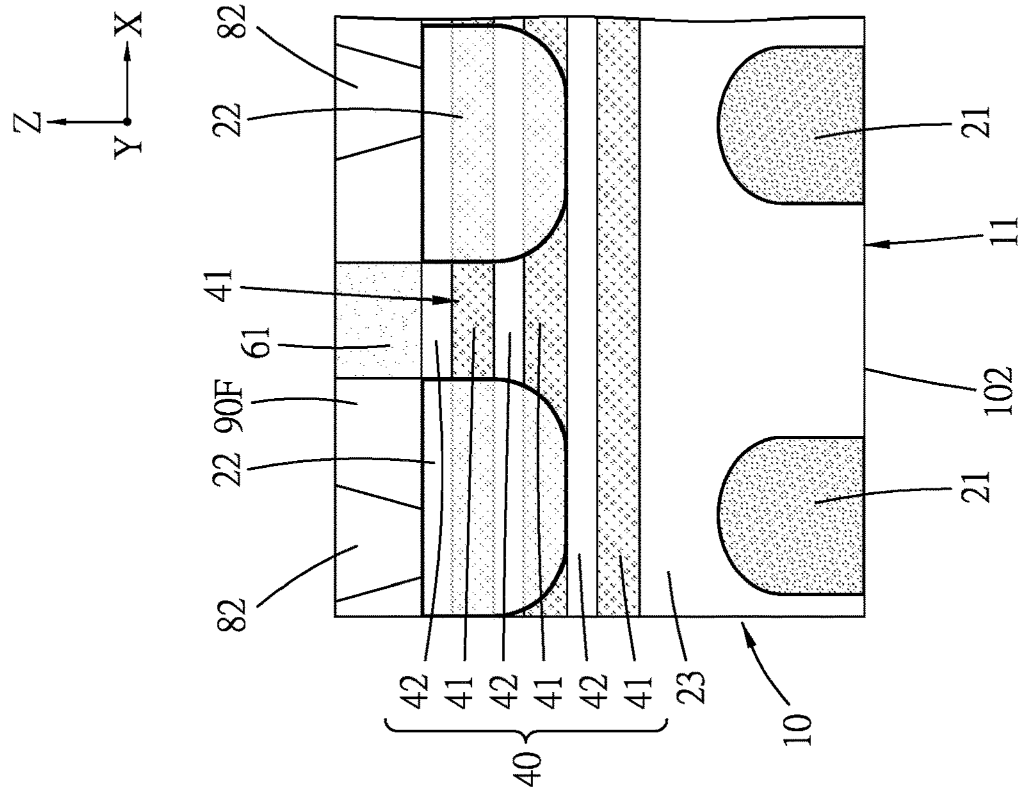

Referring to FIG. 4 and the example illustrated in FIG. 8, the method proceeds to step 304, where lower features 21

(equivalent to the first features 21 described in FIG. 1) are formed by performing a back-side ion implantation process at the back surface 102 of the first base region 11 in position corresponding to the upper features 22.

To obtain the structure shown in FIG. 8, the following sub-steps are performed: (i) forming the front dielectric layer 90F over the upper surface 401 surrounding the sacrificial gate feature 61' (which may include depositing a material layer for forming the front dielectric layer 90F over the upper surface 401 to cover the sacrificial gate feature 61' using CVD, ALD or other suitable technique, followed by removing an upper portion of the material layer for forming the front dielectric layer 90F to expose the sacrificial gate feature 61' using chemical mechanical polishing (CMP) or other suitable techniques); (ii) replacing the sacrificial gate feature 61' with the dummy gate 61 (which may include removing the sacrificial gate feature 61' using a suitable etching process, depositing material layers for forming the dummy gate 61 using CVD, ALD or other suitable techniques, and removing an upper portion of material layers for forming the dummy gate 61 using CMP or other suitable techniques; (iii) forming the front side contacts 82 in the front dielectric layer 90F so as to be respectively connected to the second features 22 (which may include patterning the front dielectric layer 90F using one or more suitable photolithography processes to form openings to expose the second features 22, filling the openings with materials for forming the front side contacts 82 using CVD. ALD or other suitable techniques, and removing excess materials using CMP or other suitable techniques to expose the front dielectric layer 90F); and (iv) performing the back-side ion implantation process at the back surface 102 of the base structure 10. In some embodiments, the gate spacers (not shown) formed in step 302 are located at two opposite sides of the dummy gate 61 in the X direction.

In sub-step (iv), second dopants are implanted into the first base region 11 through the back surface 102 to form the lower features 21. The second dopants are responsible for the conductivity type of the lower features 21 (i.e., the first features 21). Each of the lower features 21 extends from the back surface 102 toward a respective one of the upper features 22. In some embodiments, the second dopants may be further implanted into the semiconductor stack 40, although not shown in FIG. 8.

Parameters for the back-side ion implantation process may be adjusted according to practical needs. Please note that the first dopants used in the front-side ion implantation process should be in opposite conductivity with the second dopants used in the back-side ion implantation process, so as to form the lower and upper features 21, 22 with opposite conductivity types.

In some embodiments, for each of the diode devices 20, a portion of the base structure 10 and a portion of the semiconductor stack 40 that are not subjected to the front-side and back-side ion implantation processes and that are located between the lower and upper features 21, 22 serve as the third features 23. In such case, the diode devices 20 are known as PIN diodes.

In other embodiments, for each of the diode devices 20, the lower and upper features 21, 22 formed are in contact with each other, and the third feature 23 is omitted. In such case, the diode devices 20 are known as PN diodes.

Referring to FIG. 4 and the example illustrated in FIG. 1, the method proceeds to step 305, where the back side contacts 81 are formed. Step 305 includes the following sub-steps: (i) forming the back dielectric layer 90B over the back surface 102 (see FIG. 8) using CVD, ALD or other suitable techniques, (ii) patterning the back dielectric layer 90B using one or more suitable photolithography processes to form openings (not shown) that respectively expose the lower features 21, and (iii) forming the back side contacts 81 by filling material(s) for forming respectively in the openings using CVD, ALD or other suitable techniques, followed by removing an excess of the material(s) using CMP or other suitable techniques to expose the back dielectric layer 90B, so as to obtain the structure shown in left side of FIG. 1.

Figure 9:
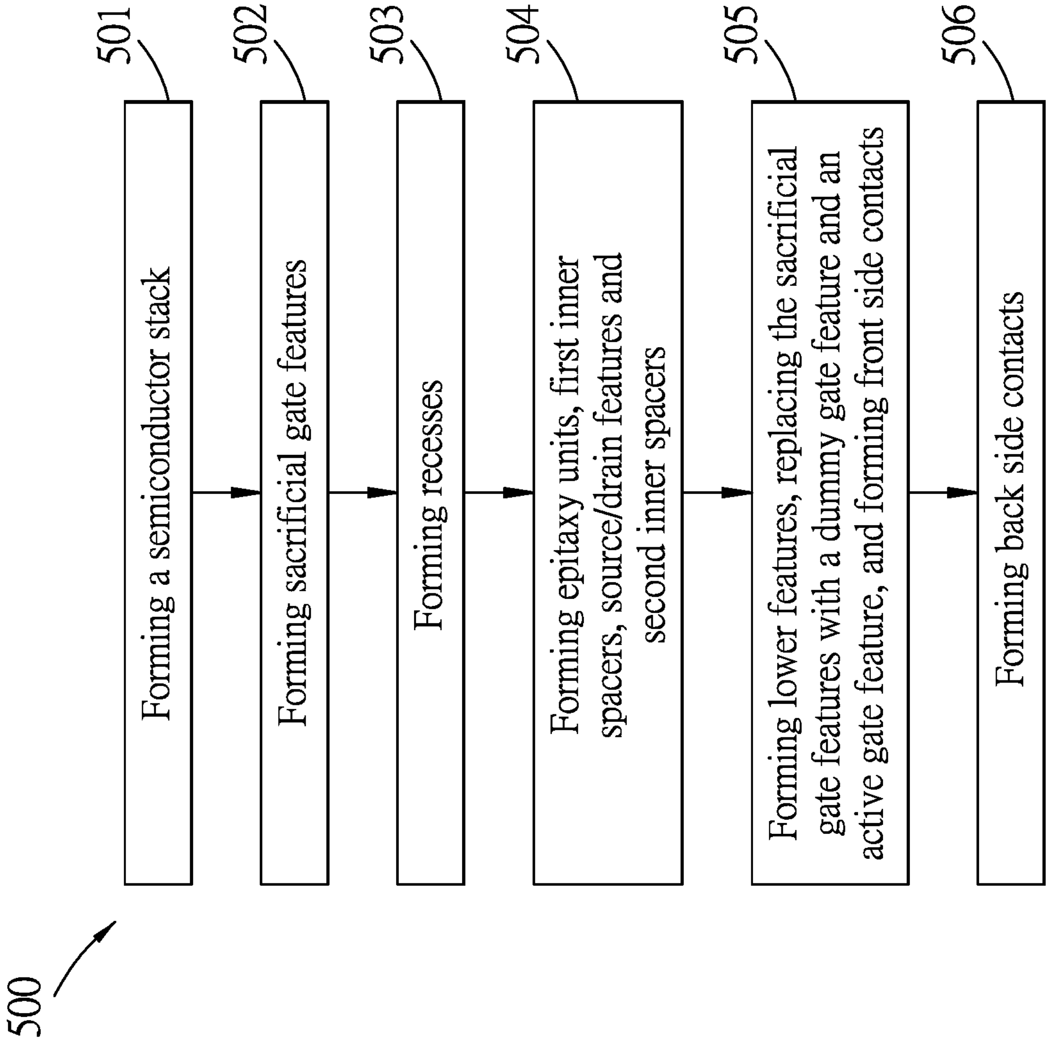
FIG. 9 is a flow diagram illustrating a method for manufacturing the semiconductor structure shown in FIG. 3.

In some other embodiments, for the semiconductor structure 200, where elements at the first and second base regions 11, 12 having similar configurations can be formed together. FIG. 9 is a flow diagram illustrating a method 500 for manufacturing the semiconductor structure 200 shown in FIG. 3 in accordance with some embodiments of the present disclosure. In method 500, preparation of the diode devices 20 is integrated into preparation of the semiconductor device 30. FIGS. 10 to 14 illustrate schematic views of intermediate stages of the method 500 in accordance with some embodiments. Some repeating structures are omitted in FIGS. 10 to 14 for the sake of brevity. Additional steps can be provided before, after or during the method, and some of the steps described herein may be replaced by other steps or be eliminated.

Figure 10:
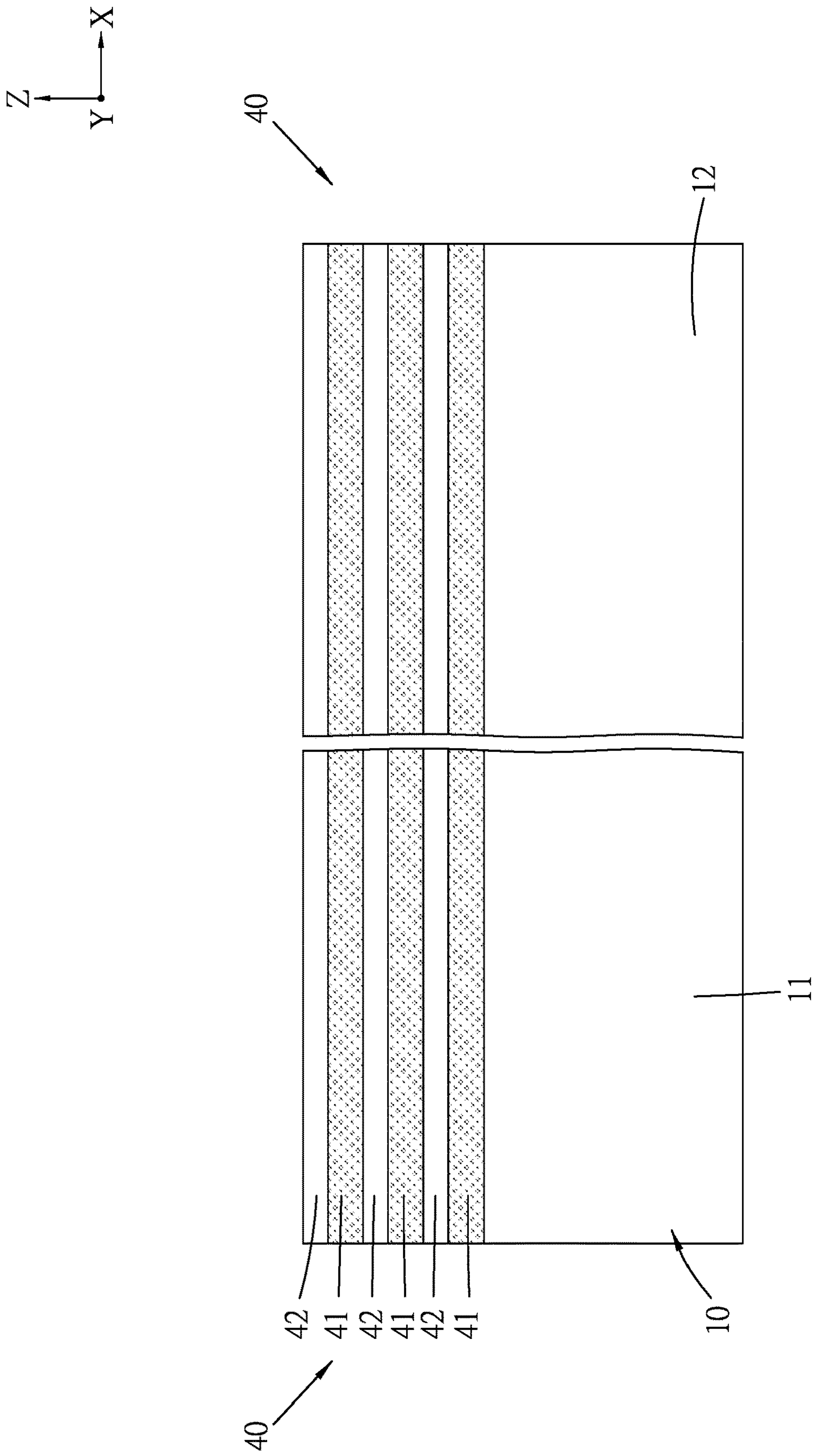
FIGS. 10 to 14 are schematic views illustrating intermediate stages of a method for manufacturing the semiconductor structure shown in FIG. 3 in accordance with some embodiments.

Referring to FIG. 9 and the example illustrated in FIG. 10, the method begins with step 501, where the semiconductor stack 40 is formed on each of the first and second base regions 11, 12 of the base structure 10. Step 501 is similar to step 301 described with reference to FIG. 5, and details thereof are omitted for the sake of brevity.

Figure 11:
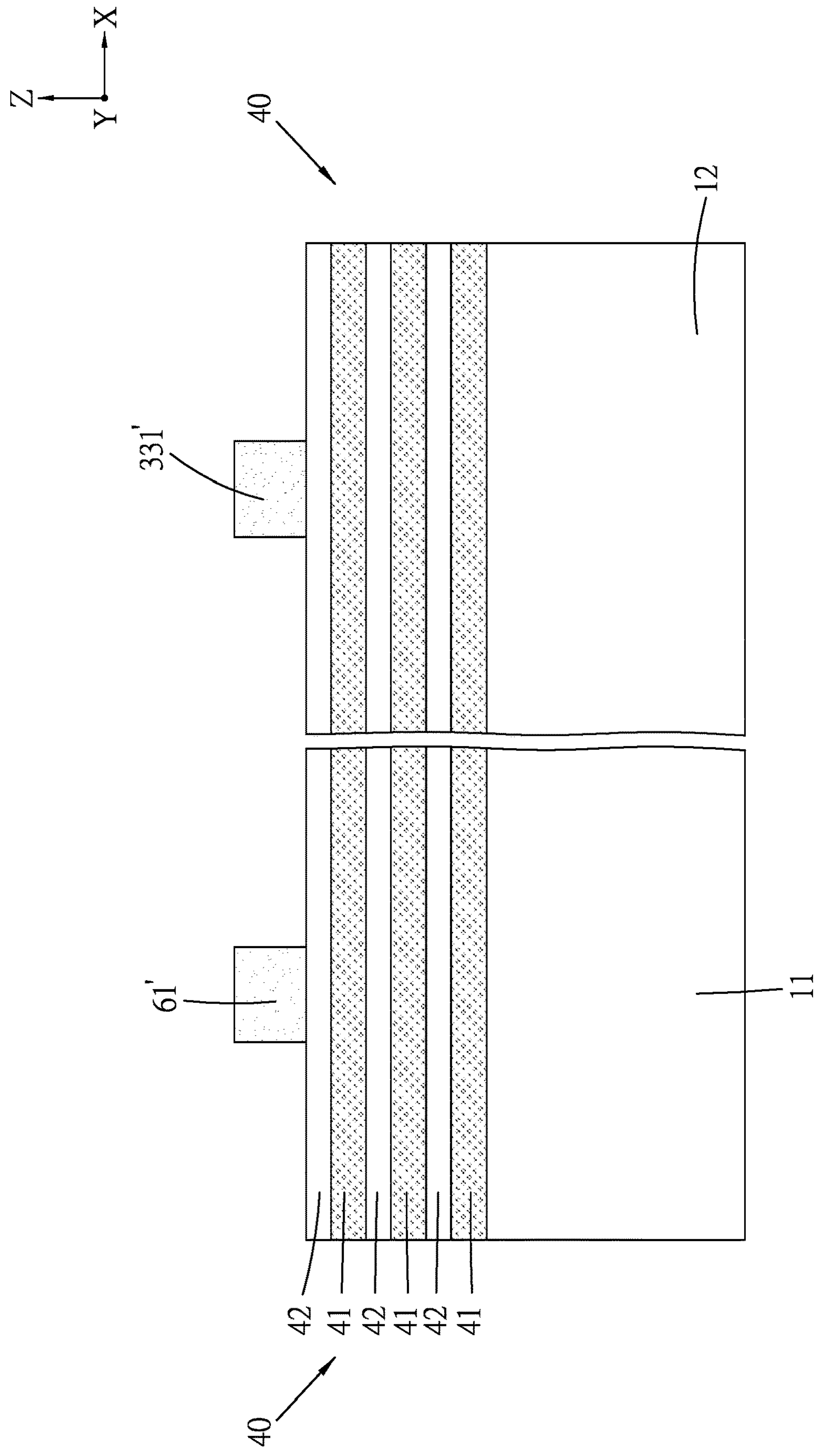

Referring to FIG. 9 and the example illustrated in FIG. 11, the method proceeds to step 502, where a first sacrificial gate feature 61' is formed on the semiconductor stack 40 at the first base region 11, and a second sacrificial gate feature 331' is formed on the semiconductor stack 40 at the second base region 12. The first and second sacrificial gate features 61', 331' are each formed in a manner similar to that of the sacrificial gate feature 61' described with reference to FIG. 6, and may be formed simultaneously, and details thereof are omitted for the sake of brevity.

Figure 12:
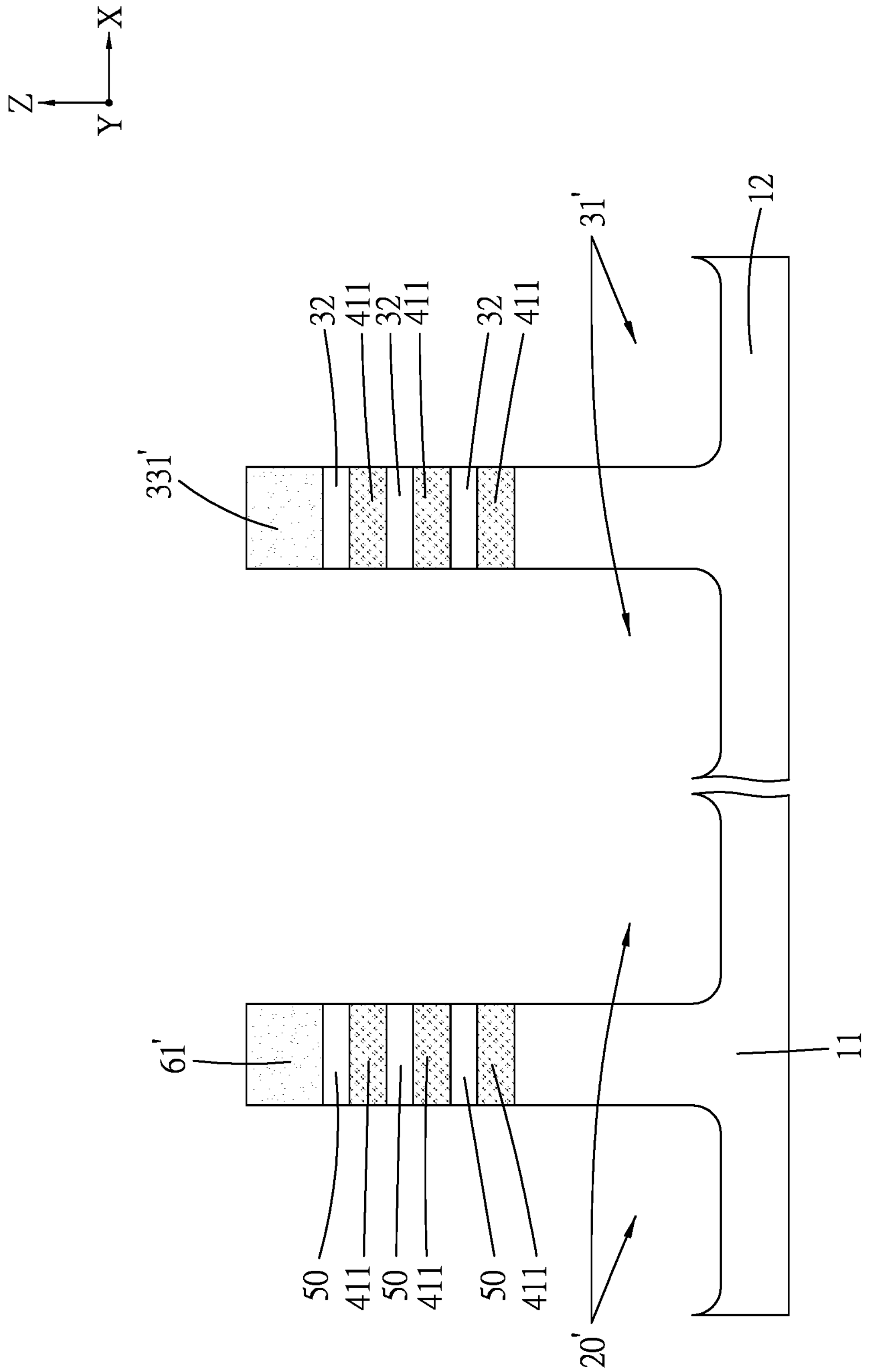

Referring to FIG. 9 and the example illustrated in FIG. 12, the method proceeds to step 503, where two first recesses 20' are formed in the semiconductor stack 40 and the base structure 10 at the first base region 11, and two second recesses 31' are formed in the semiconductor stack 40 and the base structure 10 at the second base region 12. The first and second recesses 20', 31' may be formed simultaneously by etching the semiconductor stack 40 at the first base region 11 exposed from the first sacrificial gate features 61' and etching the semiconductor stack 40 at the second base region 12 exposed from the second sacrificial gate features 311' (see FIG. 11) using any suitable processes, such as a dry etching process, a wet etching process, or a combination thereof, but are not limited thereto.

After step 503, at the first base region 11, the first semiconductor layers 41 (see FIG. 11) are formed into sacrificial semiconductor layers 411 (which are to be formed into the lower gates 62 and the first inner spacers 70 as shown in FIG. 3), and the second semiconductor layers 42 are formed into the dummy channel features 50. At the second base region 12, the first semiconductor layers 41 (see FIG. 11) are formed into sacrificial semiconductor layers 411 (which are to be formed into the lower gates 332 and the second inner spacers 34 as shown in FIG. 3), and the second semiconductor layers 42 are formed into the active channel features 32. The sacrificial semiconductor layers 411 at the first base region 11 and the sacrificial semiconductor layers 411 at the second base region 12 are similar to each other in terms of configurations and materials, while the dummy channel features 50 at the first base region 11 and the active channel features 32 at the second base region 12 are similar to each other in terms of configurations and materials.

Figure 13:
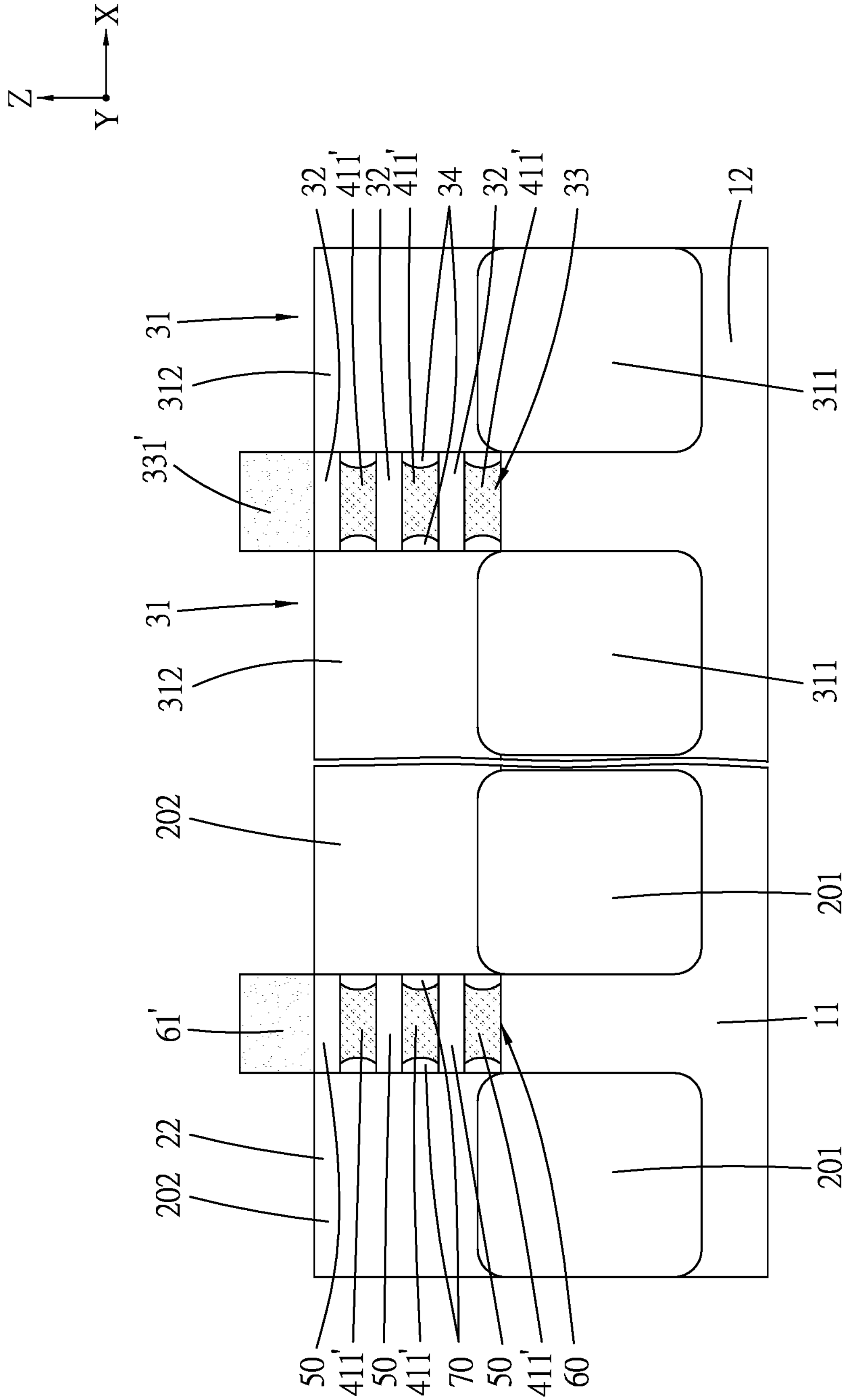

Referring to FIG. 9 and the example illustrated in FIG. 13, the method proceeds to step 504, where the epitaxy units (each including the epitaxy layers 201, 202) and the first inner spacers 70 are formed at the first base region 11, and the source/drain features 31 and the second inner spacers 34 are formed at the second base region 12.

Step 504 may include the following sub-steps: (i) simultaneously removing opposite ends of each of the sacrificial semiconductor layers 411 shown in FIG. 12 at both the first and second base regions 11, 12 (the remaining sacrificial semiconductor layers shown in FIG. 13 are denoted as 411'); (ii) simultaneously forming the first inner spacers 70 respectively at the opposite ends of the remaining sacrificial semiconductor layers 411' at the first base region 11, and forming the second inner spacers 34 respectively at the opposite ends of the remaining sacrificial semiconductor layers 411 at the second base region 12; and (iii) simultaneously forming the epitaxy units respectively in the first recesses 20', and the source/drain features 31 respectively in the second recesses 31'. In some embodiments, in step 504, sub-step (i) may involve one or more selective etching processes (e.g., dry etching, wet etching, or a combination thereof, sub-step (ii) may involve one or more deposition processes (e.g., CVD, ALD or other suitable techniques) and one or more etching processes (e.g., an anisotropic etching process or other suitable processes), and sub-step (iii) may involve CVD, molecular-beam epitaxy (MBE), an epitaxial deposition/partial etch process, such as a cyclic deposition-etch (CDE) process and/or a selective epitaxial growth (SEG) process. In sub-step (iii) of step 504, the epitaxy units and the source/drain features 31 are formed simultaneously, and thus have the same conductivity type.

In sub-step (iii), any suitable epitaxy growth process may be adopted to simultaneously form the epitaxy units and the source/drain features 31. The intrinsic epitaxy layers (the epitaxy layers 201 of the epitaxy units and the epitaxy layers 311 of the source/drain features 31) and the in situ doped epitaxy layers (the epitaxy layers 202 of the epitaxy units and the epitaxy layers 312 of the source/drain features 31) are sequentially formed.

Referring to FIG. 9 and the example illustrated in FIG. 14, the method proceeds to step 505, where lower features 21 (equivalent to the first features 21 described in FIG. 3) are formed by performing a back-side ion implantation process (which may be performed in a way similar to that described with reference to FIG. 8) at the back surface 102 of the first base region 11 in position corresponding to the epitaxy layers 202 of the epitaxy units.

Figure 14:
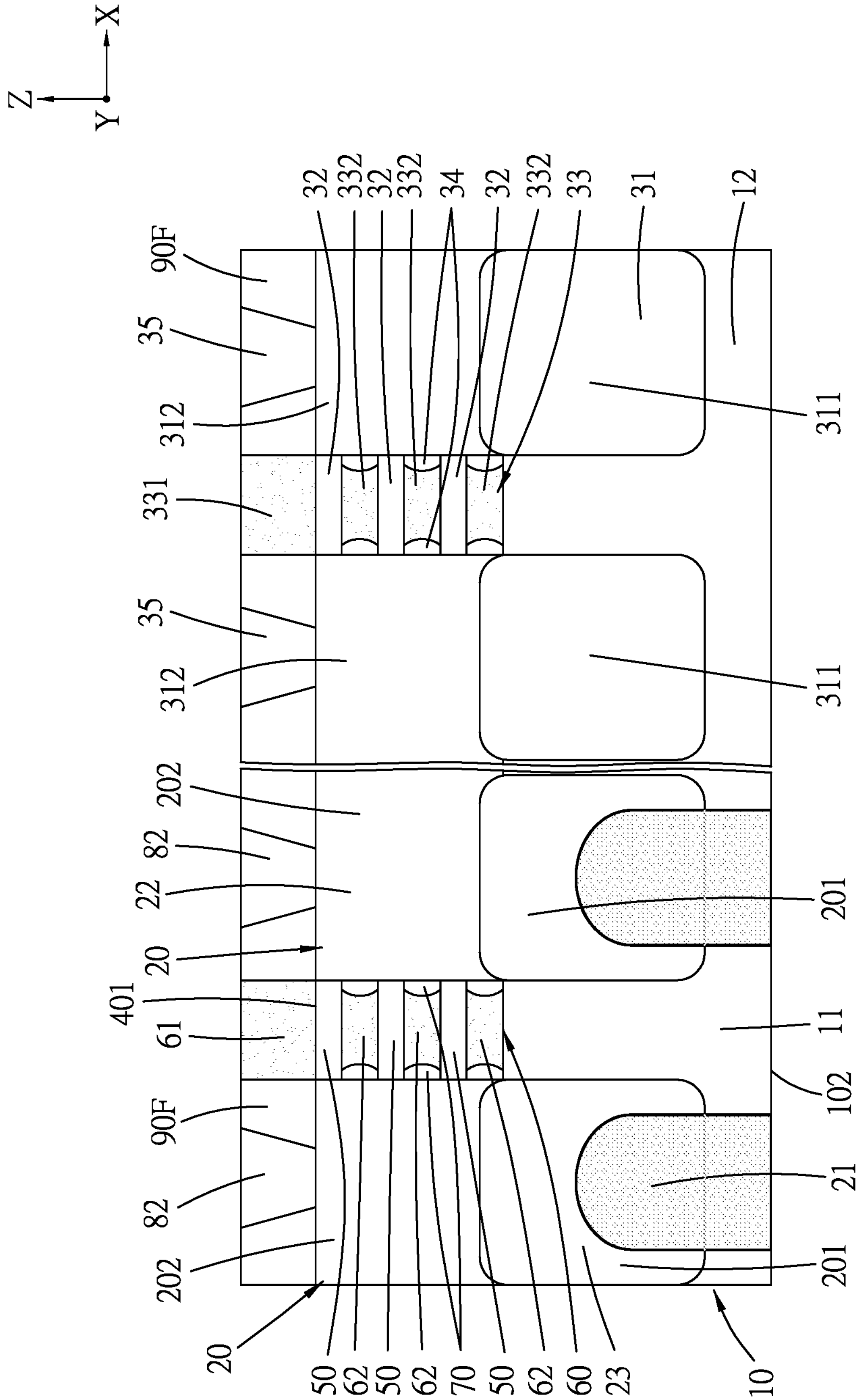

To obtain the structure shown in FIG. 14, the following sub-steps are performed: (i) forming the front dielectric layer 90F on the epitaxy units and the source/drain features 31 surrounding the first and second sacrificial gate features 61', 331' in a manner similar to sub-step (i) of step 304; (ii) simultaneously replacing the first sacrificial gate feature 61' (see also FIG. 13) with the dummy gate feature 60, and replacing the second sacrificial gate feature 331' with the active gate feature 331 in a manner similar to sub-step (ii) of step 304; (iii) simultaneously forming the front side contacts 82 and the source/drain contacts 35 in the front dielectric layer 90F in a manner similar to sub-step (iii) of step 304 such that the first side contacts 82 are respectively connected to the epitaxy layers 202 and the source/drain contacts 35 are respectively connected to the epitaxy layers 312; and (iv) performing an ion implantation process on the back surface 102 of the first base region 11.

In sub-step (iv), dopants which are responsible for the conductivity type of the lower features 21 are implanted into the first base region 11 and into the epitaxy layers 201 through the back surface 102 to form the lower features 21. Each of the lower features 21 extends from the back surface 102 toward a respective one of the epitaxy layers 202. Parameters for the ion implantation process in sub-step (iv) may be adjusted according to practical needs. Please note that the dopants used in the ion implantation process should be in opposite conductivity with that of the dopants used in forming the epitaxy layers 202. As such, the lower features 21 may serve as the first features 21 described in FIG. 3, and the epitaxy layers 202 may serve as the second features 22 in FIG. 3. Each of the lower features 21, a portion of a corresponding one of the epitaxy layers 201 that is not subjected to the ion implantation process, and a corresponding one of the epitaxy layers 202 cooperatively form the vertical PIN diode device 20.

In some embodiments, in sub-step (iii) of step 504, the intrinsic epitaxy layers may be omitted, i.e., the in situ doped epitaxy layers are directly formed on the base structure 10, and/or in sub-step (iv) of step 505, the lower features 21 are formed to be in direct contact with the epitaxy layers 202 so as to form the diode devices 20 as vertical PN diodes.

Referring to FIG. 9 and the example illustrated in FIG. 3, the method proceeds to step 506, where the back side contacts 81 are formed. Since step 506 includes the following sub-steps: (i) forming the back dielectric layer 90B over the back surface 102 of the base structure 10 (see FIG. 14) in a manner similar to sub-step (i) of step 305, (ii) patterning the back dielectric layer 90B to form openings (not shown) in a manner similar to sub-step (ii) of step 305 such that the lower features 21 are exposed from the openings, and (iii) forming the back side contacts 81 in a manner similar to sub-step (iii) of step 305, so as to obtain the semiconductor structure 200 shown in FIG. 3.

In addition, a process for forming the semiconductor device 30 shown in the right side of FIG. 1 is similar to that for forming the semiconductor device 30 shown in FIG. 3, and thus, details thereof are omitted for sake of brevity. In some embodiments, the semiconductor structure 100 shown in FIG. 1 may be made using method 500 but the recesses 20', the first inner spacers 70 and the epitaxy units are not formed at the first base region 11 in steps 503 and 504, instead, before or after steps 503 and 504, the upper features 22 are formed in the semiconductor stack 40 in a manner similar to step 303 of method 300.

The embodiments of the present disclosure have the following advantageous features. By forming the diode devices 20 as vertical diodes in the semiconductor stack 40 having the alternately arranged semiconductor layers 41, 42, the electric current passing therethrough in the normal direction (i.e., the direction normal to the back surface 102 of the base structure 10) is less likely to be impacted by the lattice mismatch defects between the semiconductor layers 41, 42, and thus the diode devices 20 may behave like ideal diodes. In addition, the vertical configuration of the diode devices 20 is beneficial in reducing the size of the semiconductor structure of the present disclosure. Moreover, since various elements on the first base region 11 and the second base region 12 are similar to each other, preparation of the diode devices 20 at the first base region 11 may be readily integrated into preparation of the semiconductor devices 30 at the second base region 12, thereby simplifying the manufacturing process of such semiconductor structure.

In accordance with some embodiments of the present disclosure, a semiconductor structure includes a base structure, at least one diode device and a semiconductor device. The base structure has a first base region and a second base region. The at least one diode device includes a first feature formed in the first base region, and a second feature formed over the first feature and having a conductivity type opposite to that of the first feature. The semiconductor device is formed on the second base region.

In accordance with some embodiments of the present disclosure, the semiconductor structure further includes a semiconductor stack formed on the first base region. The semiconductor stack includes first semiconductor layers and second semiconductor layers which are disposed to alternate with the first semiconductor layers, and which are made of a material different from that of the first semiconductor layers. The second feature is formed in the semiconductor stack.

In accordance with some embodiments of the present disclosure, the base structure has a front surface and a back surface opposite to the front surface. The semiconductor stack has an upper surface and a lower surface which is opposite to the upper surface and which is connected to the front surface of the base structure at the first base region. The semiconductor device is formed on the front surface at the second base region. The first feature extends from the back surface at the first base region toward the second feature. The second feature extends from the upper surface toward the first feature.

In accordance with some embodiments of the present disclosure, the at least one diode device further includes a third feature that includes a portion of the first base region and a portion of the semiconductor stack and that is disposed between the first feature and the second feature. The third feature has a dopant concentration lower than that of each of the first feature and the second feature.

In accordance with some embodiments of the present disclosure, the third feature has an intrinsic conductivity type.

In accordance with some embodiments of the present disclosure, the at least one diode device is a PIN diode.

In accordance with some embodiments of the present disclosure, the third feature has a thickness greater than 0 nm and not greater than 100 nm.

In accordance with some embodiments of the present disclosure, the at least one diode device includes two diode devices. The first features of the two diode devices are formed in the first base region and spaced apart from each other in an X direction by a first in-between region. The second features of the two diode devices are formed in the semiconductor stack and spaced apart from each other in the X direction by a second in-between region which is located above the first in-between region. The first feature and the second feature of each of the two diode devices are displaced from each other in a Z direction transverse to the X direction.

In accordance with some embodiments of the present disclosure, the semiconductor structure further includes a dummy gate formed over the first in-between region and the second in-between region, and elongated in a Y direction transverse to both the X direction and the Z direction.

In accordance with some embodiments of the present disclosure, the at least one diode device includes two diode devices. The first features of the two diode devices are formed in the first base region and spaced apart from each other in an X direction. The first feature and the second feature of each of the two diode devices are displaced from each other by the third feature in a Z direction transverse to the X direction. The semiconductor structure further includes dummy channel features and a dummy gate feature. The dummy channel features are spaced apart from each other in the Z direction. Each of the dummy channel features interconnects the second features of the two diode devices. The dummy gate feature is formed around the dummy channel features.

In accordance with some embodiments of the present disclosure, the semiconductor device includes two source/drain features, active channel features and an active gate feature. The two source/drain features are spaced apart from each other in the X direction. The active channel features are spaced apart from each other in the Z direction. Each of the active channel features interconnects the two source/drain features. The active gate feature is formed around the active channel features.

In accordance with some embodiments of the present disclosure, the semiconductor structure further includes a plurality of first inner spacers disposed to separate the second features of the two diode devices from the dummy gate feature. The semiconductor device further includes a plurality of second inner spacers disposed to separate the two source/drain features from the active gate features.

In accordance with some embodiments of the present disclosure, the semiconductor structure further includes a back side contact disposed on the first base region and connected to the first feature, and a front side contact connected to the second feature.

In accordance with some embodiments of the present disclosure, a semiconductor structure includes a base structure, and a vertical diode including a first feature, a second feature, and a third feature. The first feature is formed in the base structure. The second feature is disposed on the first feature over a front surface of the base structure such that the first feature and the second feature face each other along a Z direction normal to a back surface of the base structure opposite to the front surface. The third feature is formed between the first feature and the second feature along the Z direction. The first feature has a conductivity type opposite to that of the second feature, and the third feature has a dopant concentration lower than that of each of the first feature and the second feature.

In accordance with some embodiments of the present disclosure, the second feature is formed in a semiconductor stack disposed on the base structure. The third feature includes a portion of the first base region and a portion of the semiconductor stack.

In accordance with some embodiments of the present disclosure, the semiconductor stack includes a plurality of first semiconductor layers and a plurality of second semiconductor layers that are disposed to alternate with the first semiconductor layers, and that are made of a material different from that of the first semiconductor layers.

In accordance with some embodiments of the present disclosure, the base structure has a first base region and a second base region. The vertical diode is disposed at the first base region. The semiconductor structure further includes a semiconductor device disposed on the second base region.

In accordance with some embodiments of the present disclosure, the semiconductor structure further includes an epitaxy unit disposed on the first base region. The epitaxy unit includes a lower epitaxy layer and an upper epitaxy layer formed on the lower epitaxy layer. The upper epitaxy layer serves as the second feature. The first feature is formed in the first base region and extends into a lower part of the lower epitaxy layer such that an upper part of the lower epitaxy layer serves as the third feature. The semiconductor device includes a source/drain feature having an upper epitaxy layer and a lower epitaxy layer which are made of materials same as those, respectively, of the upper epitaxy layer and the upper part of the lower epitaxy layer of the epitaxy unit.

In accordance with some embodiments of the present disclosure, a method for manufacturing a semiconductor structure includes: forming a base structure having a first base region and a second base region; forming a diode device on the first base region, the diode device being formed with a first feature formed in the first base region, a second feature formed over the first feature, and a third feature disposed between the first feature and the second feature, the first feature having a conductivity type opposite to that of the second feature, the third feature having a dopant concentration lower than that of each of the first feature and the second feature; and forming a semiconductor device on the second base region, the semiconductor device including source/drain features having a conductivity type same as that of the second feature.

In accordance with some embodiments of the present disclosure, the method further includes forming an epitaxy unit on the first base region, the epitaxy unit including a lower epitaxy layer and an upper epitaxy layer formed on the lower epitaxy layer, the upper epitaxy layer serving as the second feature; the source/drain features and the epitaxy unit are formed simultaneously; and the first feature is formed in the first base region and extends into a lower part of the lower epitaxy layer such that an upper part of the lower epitaxy layer serves as the third feature.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
- forming a base structure having a first base region and a second base region that are spaced apart from each other in a first direction;
- forming a diode device on the first base region, the diode device being formed with
  - a first feature formed in the first base region,
  - a second feature formed over the first feature, the second feature being spaced apart from the first feature in a second direction different from the first direction, and
  - a third feature disposed between the first feature and the second feature, the first feature having a conductivity type opposite to a conductivity type of the second feature, the third feature having a dopant concentration lower than a dopant concentration of each of the first feature and the second feature, the third feature being made of a semiconductor material; and
- forming a semiconductor device on the second base region, the semiconductor device including source/drain features having a conductivity type same as the conductivity type of the second feature.

2. The method as claimed in claim 1, wherein:
- the method further comprises forming an epitaxy unit on the first base region, the epitaxy unit including a lower epitaxy layer and an upper epitaxy layer formed on the lower epitaxy layer, the upper epitaxy layer serving as the second feature;
- the source/drain features and the epitaxy unit are formed simultaneously; and
- the first feature is formed in the first base region and extends into a lower part of the lower epitaxy layer such that an upper part of the lower epitaxy layer serves as the third feature.

3. A method for manufacturing a semiconductor structure, comprising:
- forming a first semiconductor stack and a second semiconductor stack respectively on a first base region and a second base region, each of the first semiconductor stack and the second semiconductor stack including first semiconductor layers and second semiconductor layers which are disposed to alternate with the first semiconductor layers, the first semiconductor layers being made of a first semiconductor material, the second semiconductor layers being made of a second semiconductor material different from the first semiconductor material;
- performing a diode-forming process on the first semiconductor stack to form a diode device, which includes a first feature formed in the first base region and a second feature over the first feature, the first feature and the second feature having two different conductivity types; and
- performing a transistor-forming process on the second semiconductor stack to form a transistor,
- wherein the diode-forming process includes:
  - performing a front-side ion implantation process on an upper surface of the first semiconductor stack opposite to the first base region to form the second feature which extends from the upper surface of the first semiconductor stack toward the first base region; and
  - performing a back-side ion implantation process on a back surface of the first base region opposite to the first semiconductor stack to form the first feature which extends from the back surface of the first base region toward the second feature.

4. The method as claimed in claim 3, wherein after the front-side ion implantation process and the back-side ion implantation process, a third feature is formed between the first feature and the second feature, the third feature having a dopant concentration lower than a dopant concentration of each of the first feature and the second feature.

5. The method as claimed in claim 4, wherein the third feature includes a portion of the first base region and a portion of the first semiconductor stack.

6. The method as claimed in claim 4, wherein the third feature has an intrinsic conductivity type.

7. The method as claimed in claim 4, wherein the diode device is a PIN diode.

8. The method as claimed in claim 4, wherein the third feature has a thickness greater than 0 nm and not greater than 100 nm.

9. The method as claimed in claim 3, wherein the transistor-forming process includes:

forming a sacrificial gate feature on the second semiconductor stack, the second semiconductor stack having two portions at two opposite sides of the sacrificial gate feature;

recessing the two portions of the second semiconductor stack to form two recesses so that the first semiconductor layers of the second semiconductor stack are formed into sacrificial semiconductor layers, and the second semiconductor layers of the second semiconductor stack are formed into active channel features;

growing two source/drain features respectively in the two recesses; and replacing the sacrificial gate feature and the sacrificial semiconductor layers with an active gate feature, the active gate feature being disposed around the active channel features.

10. A method for manufacturing a semiconductor structure, comprising:

forming a first semiconductor stack and a second semiconductor stack respectively on a first base region and a second base region, each of the first semiconductor stack and the second semiconductor stack including first semiconductor layers and second semiconductor layers which are disposed to alternate with the first semiconductor layers, the first semiconductor layers being made of a first semiconductor material, the second semiconductor layers being made of a second semiconductor material different from the first semiconductor material;

forming a first sacrificial gate feature and a second sacrificial gate feature respectively on the first semiconductor stack and the second semiconductor stack;

performing a diode-forming process on two portions of the first semiconductor stack to form two diode devices, the two portions of the first semiconductor stack being disposed at two opposite sides of the first sacrificial gate feature, each of the two diode devices including a first feature formed in the first base region and a second feature formed over the first feature, a conductivity type of the first feature being different from a conductivity type of the second feature; and performing a transistor-forming process on the second semiconductor stack and the second sacrificial gate feature to form a transistor.

11. The method as claimed in claim 10, wherein the diode-forming process includes:

performing a front-side ion implantation process on an upper surface of each of the two portions of the first semiconductor stack to form the second feature of each of the two diode devices, the upper surface of each of the two portions of the first semiconductor stack being located opposite to the first base region; and performing a back-side ion implantation process on a back surface of the first base region opposite to the first semiconductor stack to form the first feature of each of the two diode devices, the first feature extending from the back surface of the first base region toward the second feature.

12. The method as claimed in claim 10, wherein the diode-forming process includes:

performing a first recessing process to form two first recesses in two portions of the first semiconductor stack, the two portions of the first semiconductor stack being located at two opposite sides of the first sacrificial gate feature, so that the first semiconductor layers of the first semiconductor stack are formed into first sacrificial semiconductor layers, and the second semiconductor layers of the first semiconductor stack are formed into dummy channel features;

performing a first deposition process to form two epitaxy units respectively in the two first recesses, each of the two epitaxy units including the second feature of a corresponding one of the two diode devices;

performing a first replacement process to replace the first sacrificial gate feature and the first sacrificial semiconductor layers with a dummy gate feature, the dummy gate feature being disposed around the dummy channel features; and performing a back-side ion implantation process on back surfaces of two portions of the first base region to form two implanted regions, the two portions of the first base region being connected respectively to the two epitaxy units, each of the two implanted regions serving as the first feature of the corresponding one of the two diode devices.

13. The method as claimed in claim 12, wherein each of the two epitaxy units includes an upper epitaxy layer which serves as the second feature of the corresponding one of the two diode devices, and a lower epitaxy layer which is disposed between the upper epitaxy layer and the first base region, and which has a dopant concentration lower than a dopant concentration of the upper epitaxy layer.

14. The method as claimed in claim 13, wherein each of two implanted regions extends from one of the back surfaces of two portions of the first base region into the lower epitaxy layer of a corresponding one of the two epitaxy units.

15. The method as claimed in claim 12, wherein the transistor-forming process includes:

performing a second recessing process to form two second recesses in two portions of the second semiconductor stack, the two portions of the second semiconductor stack being located at two opposite sides of the second sacrificial gate feature, so that the first semiconductor layers of the second semiconductor stack are formed into second sacrificial semiconductor layers, and the second semiconductor layers of the second semiconductor stack are formed into active channel features;

performing a second deposition process to form two source/drain features respectively in the two second recesses; and performing a second replacement process to replace the second sacrificial gate feature and the second sacrificial semiconductor layers with an active gate feature, the active gate feature being disposed around the active channel features.

16. The method as claimed in claim 15, wherein:

the first recessing process and the second recessing process are performed simultaneously;

the first deposition process and the second deposition process are performed simultaneously; and the first replacement process and the second replacement process are performed simultaneously.

17. The method as claimed in claim 15, wherein the conductivity type of the second feature is same as a conductivity type of the two source/drain features.

18. The method as claimed in claim 15, wherein:

prior to the first deposition process, the diode-forming process further includes replacing end regions of the first sacrificial semiconductor layers with first inner spacers through the two first recesses so that after the first replacement process, the two diode devices are spaced apart from the dummy gate feature; and prior to the second deposition process, the transistor-forming process further includes replacing end regions of the second sacrificial semiconductor layers with second inner spacers through the two second recesses so that after the second replacement process, the two source/drain features are spaced apart from the active gate feature.

19. The method as claimed in claim 10, wherein a conductivity type of two source/drain features of the transistor is different from the conductivity type of the first feature, and is same as the conductivity type of the second feature.

20. The method as claimed in claim 1, wherein the diode device is formed with a dummy gate feature, and the semiconductor device is formed with an active gate feature, each of the dummy gate feature and the active gate feature extending lengthwise along a third direction different from the first direction and the second direction.

* * * * *